US009576950B1

United States Patent
Yeo et al.

(10) Patent No.: US 9,576,950 B1
(45) Date of Patent: Feb. 21, 2017

(54) CONTACTS TO TRANSITION METAL DICHALCOGENIDE AND MANUFACTURING METHODS THEREOF

(71) Applicant: Taiwan Semiconductor Manufacturing Company, Ltd., Hsin-Chu (TW)

(72) Inventors: Yee-Chia Yeo, Hsin-Chu (TW); Ling-Yen Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/840,898

(22) Filed: Aug. 31, 2015

(51) Int. Cl.
| | |
|---|---|
| *H01L 29/45* | (2006.01) |
| *H01L 49/02* | (2006.01) |
| *H01L 45/00* | (2006.01) |
| *H01L 27/07* | (2006.01) |
| *H01L 23/535* | (2006.01) |
| *H01L 29/78* | (2006.01) |

(52) U.S. Cl.
CPC ......... *H01L 27/0738* (2013.01); *H01L 23/535* (2013.01); *H01L 28/24* (2013.01); *H01L 29/78* (2013.01)

(58) Field of Classification Search
CPC .......... H01L 28/24; H01L 29/45; H01L 29/78; H01L 29/786; H01L 45/04; H01L 45/06
See application file for complete search history.

(56) References Cited

U.S. PATENT DOCUMENTS

| | | | |
|---|---|---|---|
| 7,242,041 B2 * | 7/2007 | Bucher | H01L 29/26 257/192 |
| 8,766,330 B2 * | 7/2014 | Paranjape | H01L 31/032 257/257 |
| 2014/0197459 A1 | 7/2014 | Kis et al. | |
| 2016/0155971 A1 * | 6/2016 | Strachan | H01L 51/0558 257/29 |

OTHER PUBLICATIONS

Bollinger, M.V. et al., "One-Dimensional Metallic Edge States in MoS2," Physical Review Letters, vol. 87, No. 19, Nov. 5, 2001, 4 pages.

Chang, Jiwon et al., "Ballistic performance comparison of monolayer transition metal dichalcogenide MX2 (M=MO, W; X=S, Se, Te) metal-oxide-semiconductor field effect transistors," AIP Journal of Applied Physics Letters, vol. 115, 084506, Feb. 2014, pp. 1-9.

Fathipour, Sara et al., "Exfoliated MoTe2 Field-Effect Transistor," IEEE, Device Research Conference (DRC), Jun. 23-26 2013, 2 pages.

Hwang, Wan Sik et al., "First Demonstration of Two-Dimensional WS2 Transistors Exhibiting 105 Room Temperature Modulation and Ambipolar Behavior," Device Research Conference (DRC), Jun. 18-20, 2012, 2 pages.

(Continued)

*Primary Examiner* — Thanh V Pham
(74) *Attorney, Agent, or Firm* — Slater Matsil, LLP

(57) ABSTRACT

A device includes a transition metal dichalcogenide layer having a first edge with a zigzag atomic configuration. A metallic material has a portion overlapping the transition metal dichalcogenide layer. The metallic material has a second edge contacting the first edge of the transition metal dichalcogenide layer.

20 Claims, 18 Drawing Sheets

(56) References Cited

OTHER PUBLICATIONS

Khan, J et al., "Anomalous electron transport in back-grated field-effect transistors with TiTe2 semimetal thin-film channels," AIP Applied Physics letters, vol. 100, 043109, Jan. 6, 2012, 5 pages.

Kim, Sunkook et al., "High-mobility and low-power thin-film transistors based on multilayer MoS2 crystals," Nature Communications, Article DOI: 10.1038/ncoms2018, Aug. 21, 2012, 7 pages.

Nemes-Incze, P. et al., "Graphene nanoribbons with zigzag and armchair edges prepared by scanning tunneling microscope lithography on gold substrates," Elsevier, Applied Surface Science, 291, www.elsevier.com/locate/apsusc, Nov. 13, 2013, pp. 48-52.

Popov, Igor et al., Designing Electrical Contacts to MoS2 Monolayers: A Computational Study, Physical Review Letters, PRL 108, 156802, Apr. 13, 2012, 5 pages.

Radisavljevic, B. et al., "Single-layer MoS2 transistors," Nature Nanotechnology, vol. 6, Letters DOI: 10.1038/nnano.2010.279, Mar. 2011, 5 pages.

Tapaszto, Levente et al., "Tailoring the atomic structure of graphene nanoribbons by scanning tunneling microscope lithography," Letters, www.nature.com/naturenanotechnology, vol. 3, Jul. 2008, 5 pages.

Wang, Qing Hua et al., "Electronics and optoelectronics of two-dimensional transition metal dichalcogenides," Nature Nanotechnology, Review Article, DOI: 10.1038/nnano.2012.193, Nov. 6, 2012, 14 pages.

\* cited by examiner

CONTACTS TO TRANSITION METAL DICHALCOGENIDE AND MANUFACTURING METHODS THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semi-conductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. Field Effect Transistors (FETs) are commonly known transistors.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

In recent development of transistors, Transition Metal Dichalcogenide (TMD) materials are used for forming the transistors. The TMD materials form the active regions, which include the channel regions and source and drain regions. However, TMD materials are semiconductor materials, and hence the contact resistance to the source and drain regions is high.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
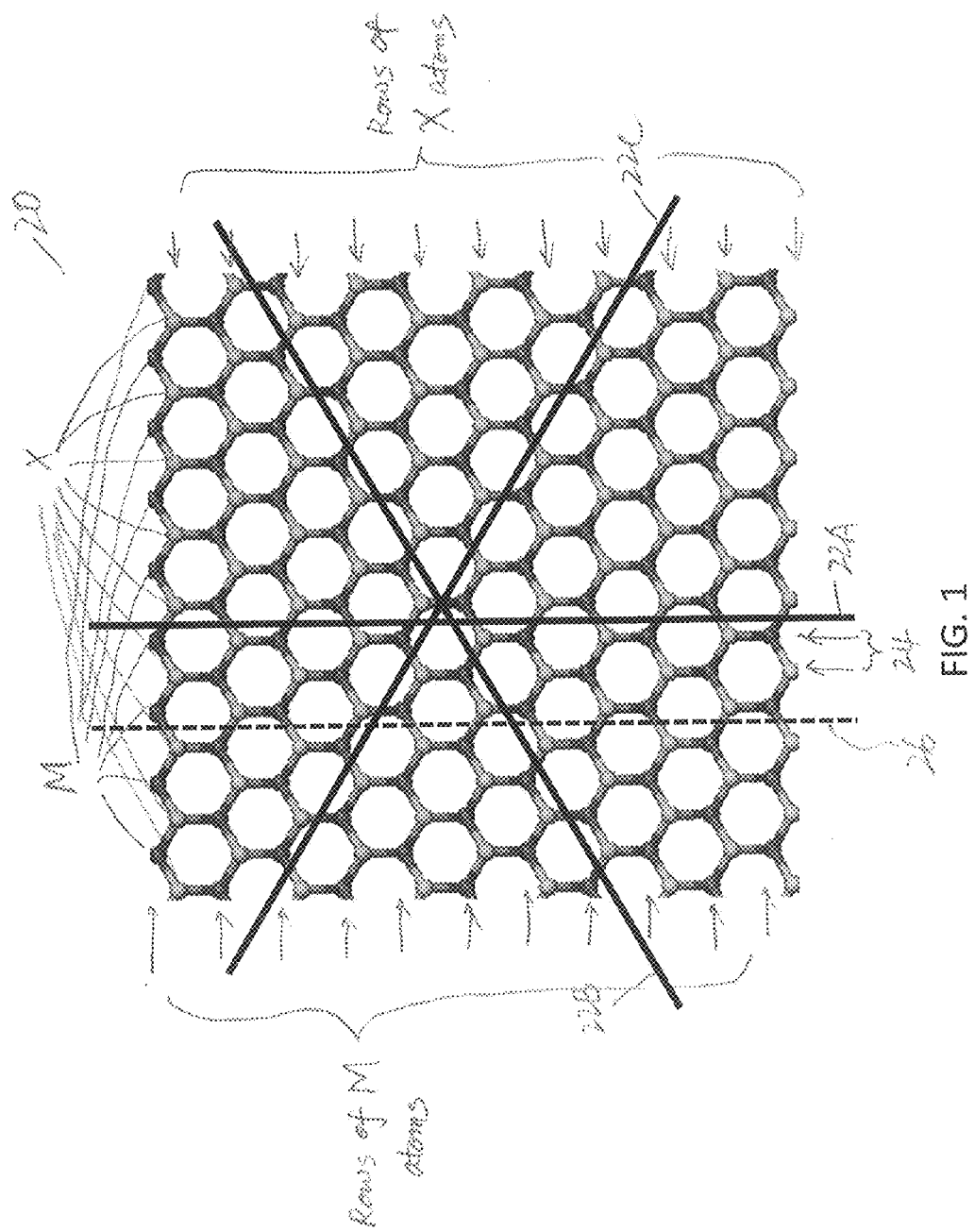
FIG. 1 illustrates an atomic structure of a Transition Metal Dichalcogenide (TMD) material and semi-conductive edges that can be formed from the TMD material in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and resistors based on Transition Metal Dichalcogenide (TMD) materials and the methods of forming the same are provided in accordance with various exemplary embodiments. Throughout the various views and illustrative embodiments, like reference numbers are used to designate like elements.

FIG. 1 illustrates an atomic structure of TMD material 20. TMD materials include a class of materials that have the general chemical formula of $MX_2$, wherein M is a transition metal element, and X is a chalcogen. The exemplary materials of the transition metal M include Ti, V, Co, Ni, Zr, Mo, Tc, Rh, Pd, Hf, Ta, W, Re, Ir, and Pt. Element X may be S, Se, or Te. Exemplary TMD materials include $MoS_2$, $MoSe_2$, $WS_2$, $WSe_2$, $MoTe_2$, and $WTe_2$ in accordance with some exemplary embodiments. TMDs form a layered structure with the form X-M-X, wherein the chalcogen atoms X are distributed in two hexagonal planes separated by a plane of metal atoms X.

In FIG. 1, chalcogen atoms X are distributed as a first plurality of rows, and transitional metal elements M are distributed as a second plurality of rows, with the first and the second rows of atoms distributed alternatingly. The illustrated chalcogen atoms X (a first plurality of chalcogen atoms) are in a first plane, and the illustrated transition metal atoms M are in a second plane beneath the first plane. Also, there is a third plane, in which a second plurality of chalcogen atoms X is located. The third plane is further beneath the second plane. In accordance with some embodiments in which TMD material 20 has a 2H poly types (with a trigonal prism structure), as illustrated, the second plurality of chalcogen atoms X is overlapped by the illustrated first plurality of chalcogen atoms X in a one-to-one correspondence, and hence are not visible in FIG. 1. The first and the second plurality of chalcogen atoms X and the metal atoms M are bonded together to form a mono-layer of TMD through chemical bonds, wherein the mono-layer includes three planes of atoms. In accordance with alternative embodiments, TMD material 20 may have other structures such as a trigonal antiprism structure, in which the second plurality of chalcogen atoms X are not overlapped by the illustrated first plurality of chalcogen atoms X. In accordance with some embodiments of the present disclosure, a TMD region may include one or a plurality of mono-layers, wherein the atoms in neighboring mono-layers are attracted to each other by van der Waals force, rather than chemical bonds.

FIG. 1 further illustrates lines 22A, 22B, and 22C. In the following discussion, line 22A is used as an example. It is appreciated that lines 22B and 22C are equivalent lines of line 22A, and hence the discussion regarding line 22A also applies to lines 22B and 22C. In the top view as shown in FIG. 1, the atoms on the left side of and closest to line 22A form a plurality of armchair patterns (configuration). For example, the two columns of atoms marked as 24 form the armchair patterns. Similarly, the atoms on the right side of and closest to line 22A form a plurality of armchair patterns. Accordingly, when TMD region 20 is cut along line 22A and is separated into a left part and a right part, the resulting right edge of the left part is formed of atoms having the armchair pattern, and the resulting left edge of the right part is formed of atoms having the armchair pattern also. The edges with the armchair patterns demonstrate semiconductor properties, and are accordingly referred to as semi-conductive edges.

In reality, when TMD region is cut along line 22A, the atoms on the resulting edge (wherein the atoms are referred to as edge atoms hereinafter) will reconstruct to have different shapes/patterns, and there is a plurality of possible reconstructed patterns. The edges with these patterns most likely demonstrate semiconductor properties. Regardless of how the edges are reconstructed, the respective edges are still referred to as armchair edges or semiconductive edges. Furthermore, regardless of how the edges are reconstructed, when a line is drawn in an inner region and parallel to the edge, the armchair pattern is clearly visible. For example, FIG. 1 illustrates exemplary line 26, wherein the two columns of atoms on the left of line 26 may have the armchair pattern even if the edges atoms on the right of line 26 are reconstructed.

It is realized that lines 22B and 22C are the equivalent lines of line 22A. Lines 22A, 22B, and 22C form 60 degree angles and 120 degree angles. Accordingly, if the cutting is made along line 22B or 22C, the resulting edges of TMD region 20 will also demonstrate semiconductor properties, and are accordingly referred to as armchair edges or semi-conductive edges.

Figure 2:
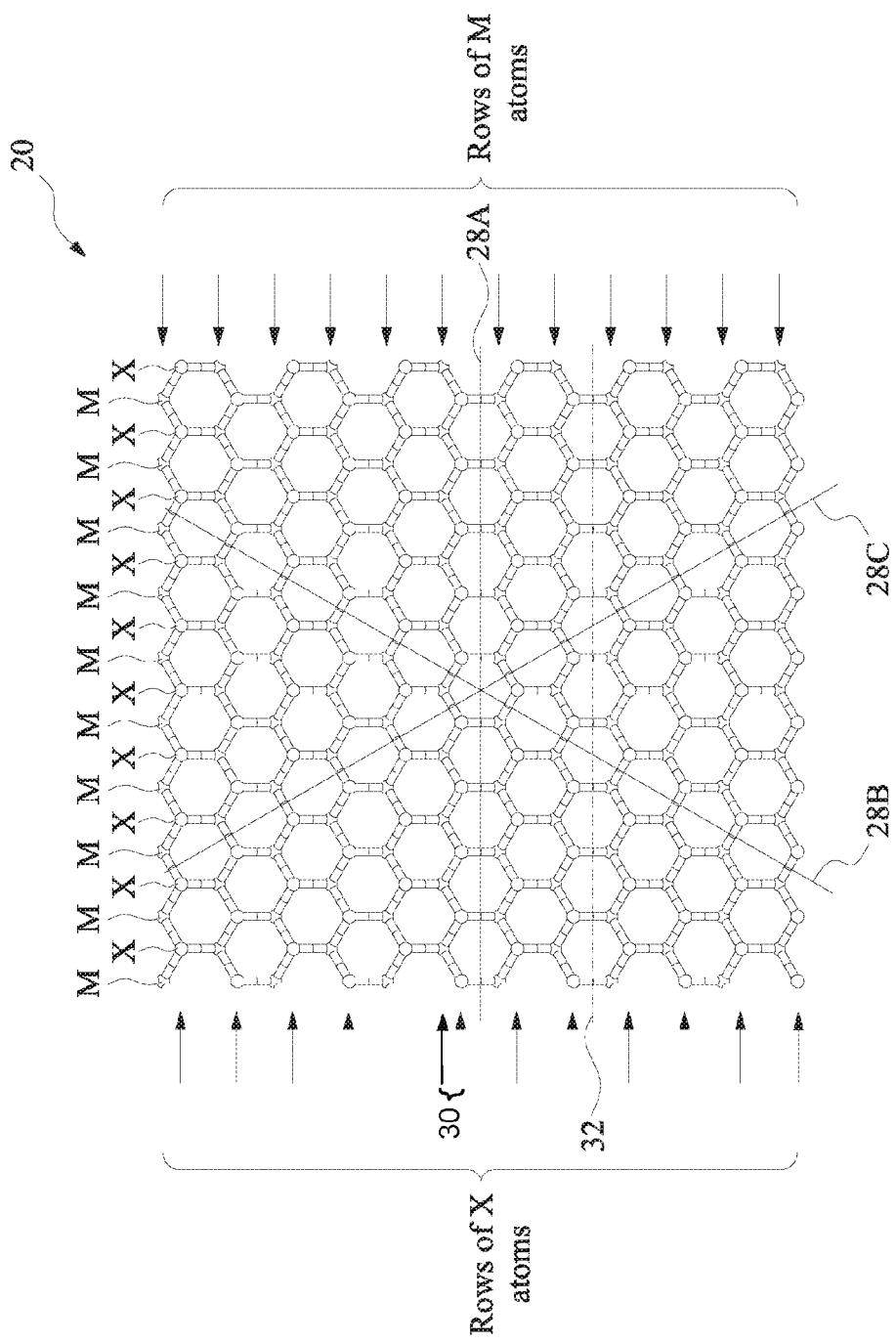
FIG. 2 illustrates an atomic structure of a TMD material and metallic edges that can be formed from the TMD material in accordance with some embodiments.

FIG. 2 further illustrates lines 28A, 28B, and 28C of the same TMD material 20. In the following discussion, line 28A is used as an example. It is appreciated that lines 28B and 28C are equivalent lines of line 28A, and hence the discussion regarding line 28A also applies to lines 28B and 28C. In the top view as shown in FIG. 2, the atoms on the upper side of and closest to line 28A form a plurality of zigzag patterns. For example, the two rows of atoms marked as 30 form a zigzag pattern (configuration). Similarly, the atoms on the lower side of and closest to line 28A form a zigzag pattern. Accordingly, when the TMD region 20 is cut along line 28A and is separated into an upper part and a lower part, the resulting bottom edge of the upper part is formed of atoms having a zigzag pattern, and the resulting top edge of the lower part is formed of atoms having a zigzag pattern also. The edges with the zigzag pattern demonstrate metallic (conductive) properties, and are accordingly referred to as metallic edges.

In reality, when TMD region is cut along line 28A, the edge atoms will also reconstruct to have different shapes/patterns, and there is a plurality of possible reconstructed patterns. The edges with these patterns most likely demonstrate metallic properties. Regardless of how the edges are reconstructed, the respective edges are still referred to as zigzag edges or metallic edges. Furthermore, regardless of how the edges are reconstructed, when a line is drawn in an inner region and parallel to the edge, the zigzag pattern is clearly visible. For example, FIG. 2 illustrates exemplary line 32, wherein the two rows of atoms below line 32 may have the zigzag pattern even if the atoms over line 32 are reconstructed.

It is realized that lines 28B and 28C are the equivalent lines of line 28A. Lines 28A, 28B, and 28C form 60 degree angles and 120 degree angles. Accordingly, if the cutting is made along line 28B or 28C, the resulting edges of the TMD region 20 will also demonstrate metallic properties, and are accordingly referred to as metallic edges. As a result of the metallic properties, when contact plugs are in contact with the metallic edges, the contact resistance is very low comparing to the contact resistance between contact plugs and the semi-conductive edges or the top surface and bottom surface of the TMD mono-layer. The metallic edges may be, for example, sulfur-terminated (−1,0,1,0) edges and/or molybdenum-terminated (1,0,−1,0) edges.

Figure 3:
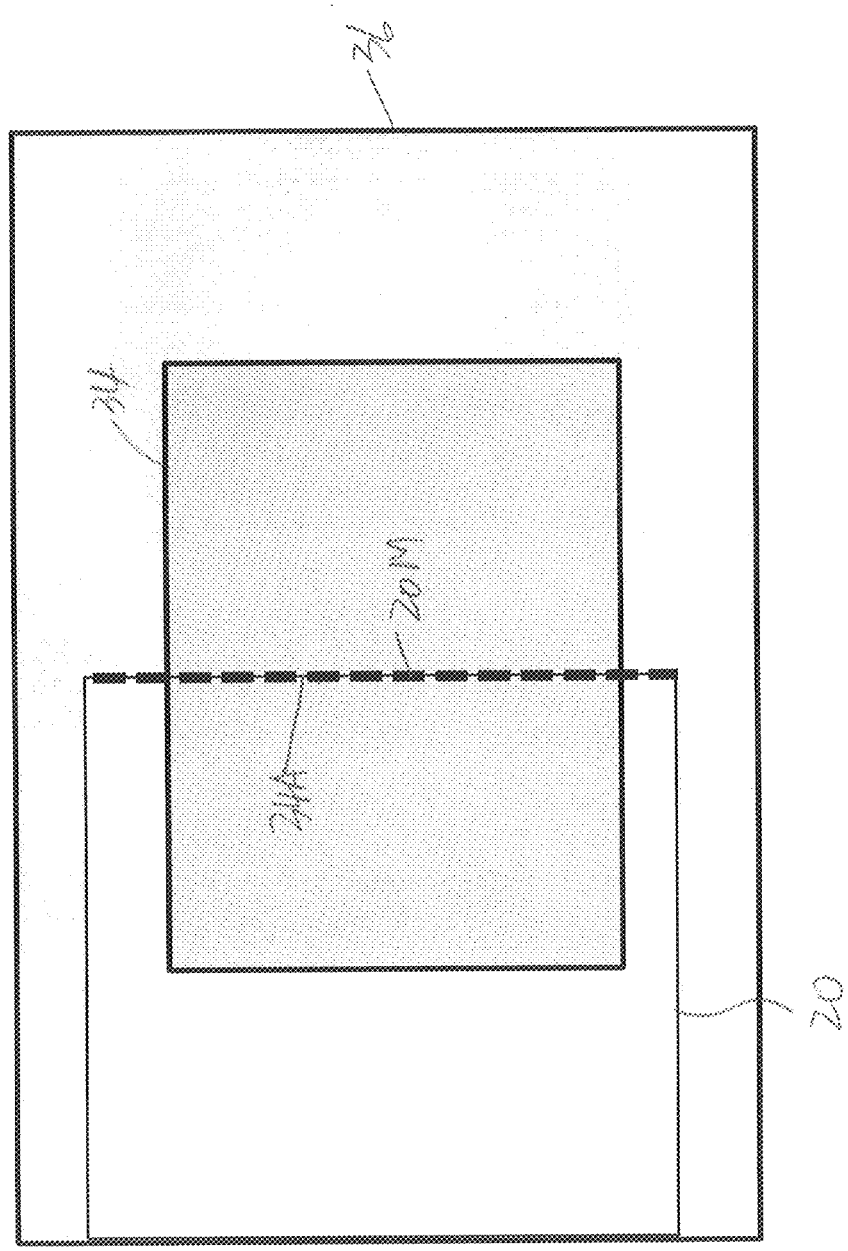
FIG. 3 illustrates a top view of a TMD region and a contact plug contacting a top surface and a metallic edge of the TMD region in accordance with some embodiments.
Figure 4:
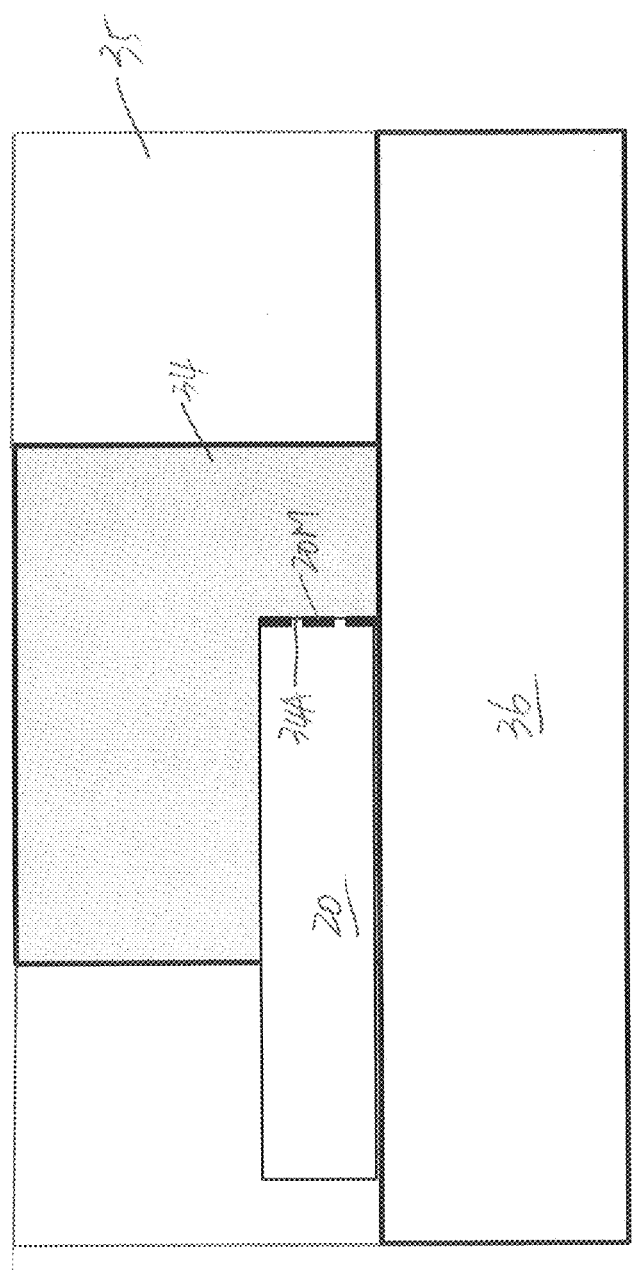
FIG. 4 illustrates a cross-sectional view of a TMD region and a contact plug contacting a top surface and a metallic edge of the TMD region in accordance with some embodiments.

FIGS. 3 and 4 illustrate a top view and a cross-sectional view, respectively, of a contact between contact plug 34 and TMD layer 20. Referring to FIG. 3, TMD region 20 is located on dielectric layer 36. Dielectric layer 36 may be formed of a material comprising, but not limited to, silicon oxide ($SiO_2$), hafnium oxide ($HfO_2$), zirconium oxide ($ZrO_2$), aluminum oxide ($Al_2O_3$), a nitride such as silicon nitride, an oxynitride such as silicon oxynitride, a carbide such as silicon carbide, or other dielectric materials.

TMD layer 20 is formed over and in contact with the top surface of dielectric layer 36. TMD layer 20 may be a mono-layer of TMD or may include a fewer mono-layers. TMD layer 20 may be formed using Chemical Vapor Deposition (CVD), with $MoO_3$ and a sulfur-containing gas such as sulfur vapor or $H_2S$ as process gases and $N_2$ as a carrier gas. The formation temperature may be between about 600° C. and about 700° C. in accordance with some exemplary embodiments, and higher or lower temperatures may be used. The process conditions are controlled to achieve the desirable total count of mono-layers. In accordance with alternative embodiments, Plasma Enhanced Chemical Vapor Deposition (PECVD) or other applicable methods are used. For example, TMD layer 20 may be formed from a flake of $MX_2$, which is mechanically exfoliated from a bulk $MX_2$ crystal, and transferred onto dielectric layer 36.

Contact plug 34 is formed in dielectric layer 35, which is sometimes referred to as an Inter-Layer Dielectric (ILD). Contact plug 34 is in contact with an edge of TMD layer 20. Furthermore, contact plug 34 may include a bottom surface (as shown in FIG. 4) contacting a top surface of TMD layer 20. Contact plug 34 is a metallic contact plug in accordance with some embodiments of the present disclosure, which includes a metal. The available materials of contact plug 34 include elemental metallic materials such as tungsten (W), copper (Cu), tantalum (Ta), titanium (Ti), aluminum (Al), hafnium (Hf), molybdenum (Mo), scandium (Sc), yttrium (Y), nickel (Ni), platinum (Pt), or combinations thereof. Contact plug 34 may have a low work function lower than 4.6 eV, for example. In accordance with some exemplary embodiments of the present disclosure, contact plug 34 is formed of a metallic nitride such as tantalum nitride (TaN), titanium nitride (TiN), tungsten nitride (WN), molybdenum nitride (MoN), etc. In accordance with other embodiments of the present disclosure, contact plug 34 is formed of a conductive metal oxide such as molybdenum oxide ($MoO_3$), ruthenium oxide ($RuO_2$), indium tin oxide, etc. Contact plug 34 may be formed by a deposition method such as CVD, Atomic Layer Deposition (ALD), or PVD.

Referring to the cross-sectional view shown in FIG. 4, edge 34A of contact plug 34 is in contact with edge 20M of TMD layer 20, wherein edge 20M is a metallic edge. As illustrated in FIG. 1, the metallic edges of TMD layer 20 are parallel to the atoms forming zigzag patterns. Accordingly, edge 34A of contact plug 34 is also parallel to the zigzag patterns of the atoms in TMD layer 20. Throughout the description, the dashed lines are used to represent the metallic edges of the TMD layers. In addition, the reference notations of the metallic edges include letter "M" following a reference number.

As shown in FIG. 4, a bottom surface of contact plug 34 and a top surface of TMD layer 20 are in contact with each other to form a metal-to-semiconductor interface. Contact plug 34 and the top surface of TMD layer 20 generally do not react with each other, and the resulting metal-to-semiconductor interface has a Van Der Waals gap or tunnel barrier. The presence of this barrier reduces the efficiency in carrier injection from contact plug 34 into TMD layer 20. Accordingly, the bottom surface of contact plug 34 and the top surface of TMD layer 20 do not form Ohmic contacts, and the contact resistance is high. On the other hand, edge 34A of contact plug 34 contacts the metallic edge 20M of TMD layer 20, and hence form Ohmic contacts. Accordingly, the contact resistance between edge 34A and 20M is low, which contributes to the significant reduction in the overall contact resistance.

Figure 5:
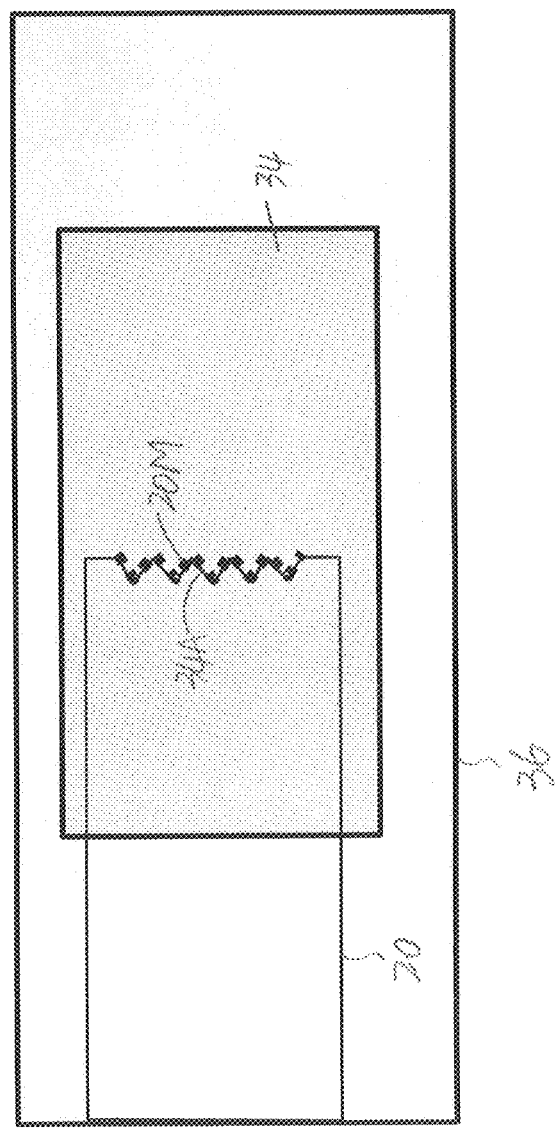
FIG. 5 illustrates a top view of a TMD region and a contact plug contacting a top surface and a zigzag metallic edge of the TMD in accordance with some embodiments.

FIG. 5 illustrates a top view of contact plug 34 contacting TMD layer 20 in accordance with alternative embodiments. This embodiment differs from the embodiment in FIG. 4 in that the edge 20M of TMD layer 20 is a zigzag edge including a plurality of straight segments. The length of each of the straight segment in the zigzag edge 20M may have a length greater than about 1 nm, and may be in the range between about 1 nm and about 100 nm, or be in the range between about 1 nm and about 10 nm. The straight segments of the zigzag edge 20M may be parallel to lines 28A, 28B, and/or 28C (FIG. 2), and the straight segments are metallic segments. The straight segments of TMD layer 20 in FIG. 5 may form 60 degree angles with each other. As a result of the zigzag edge 20M, edge 34A of contact plug 34 also has a zigzag pattern. Advantageously, by forming zigzag edge 20M, the interface area between TMD layer 20 and contact plug 34 is increased over the interface area in the embodiments in FIG. 3. Accordingly, the contact resistance between contact plug 34 and TMD layer 20 is further reduced.

Figure 6:
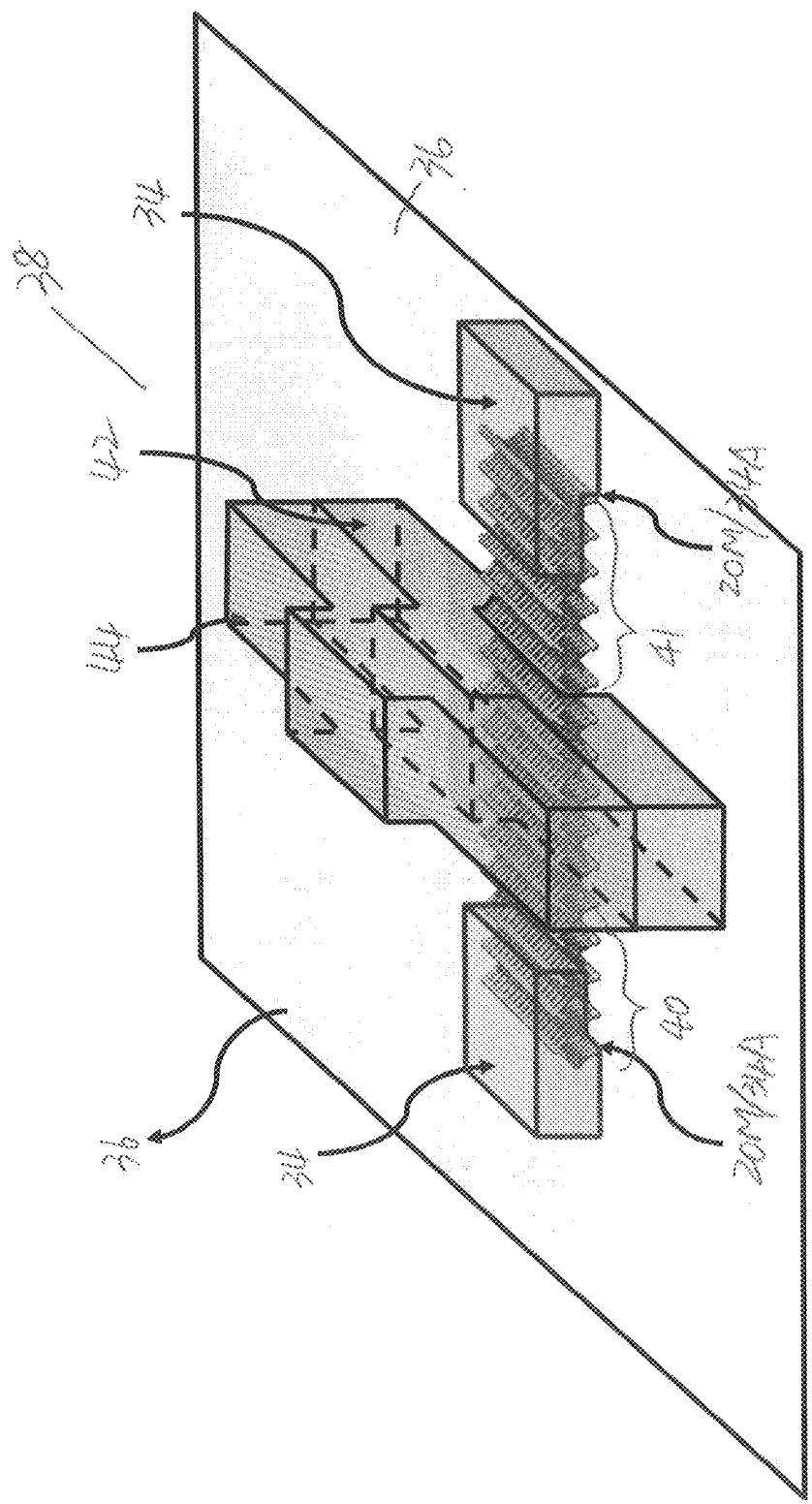
FIG. 6 illustrates a perspective view of a transistor formed of a TMD region and source/drain contact plugs in accordance with some embodiments.

FIG. 6 illustrates a perspective view of transistor 38, which is formed over dielectric layer 36. In accordance with some embodiments of the present disclosure, transistor 38 includes an active region formed of TMD layer 20, wherein the active region includes a channel region, and source region 40 and drain regions 41 on the opposite sides of the channel region. Gate dielectric 42 and gate electrode 44 are formed over the channel region. The illustrated TMD layer 20 has one mono-layer, which includes a top layer and a bottom layer formed of chalcogen atoms, and a middle layer formed of transition metal atoms. In accordance with alternative embodiments of the present disclosure, TMD layer 20 includes a plurality of mono-layers. Edge 34A of contact plugs 34 thus may contact edges 20M of all of the plurality of mono-layers.

As shown in FIG. 6, each of the source and drain contact plugs 34 includes a portion having edge 34A, which is in contact with the metallic edge 20M of TMD layer 20. Accordingly, the source/drain contact resistance is advantageously reduced.

Figure 7:
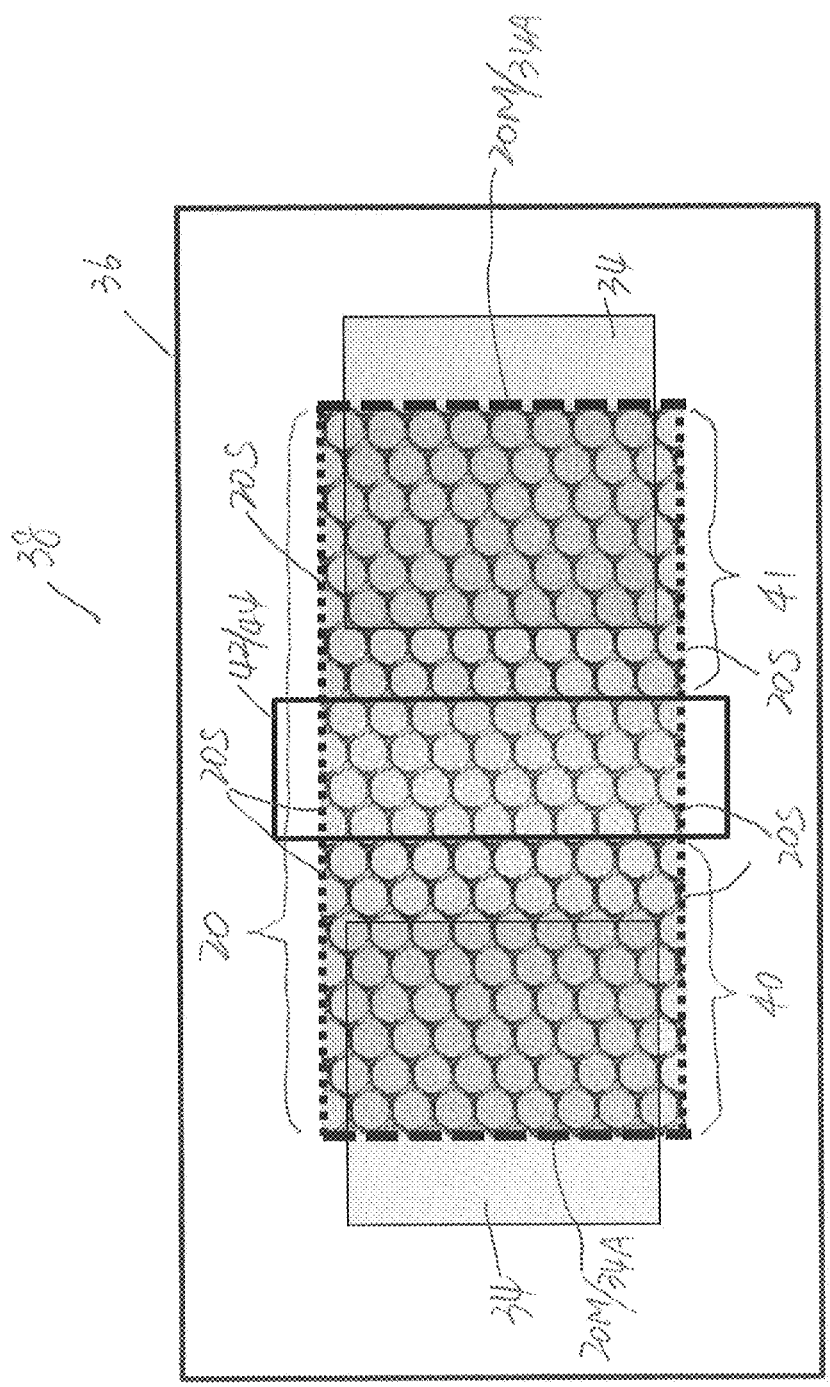
FIGS. 7 through 12 illustrate top views of transistors formed of TMD regions and source/drain contact plugs in accordance with some embodiments.

FIG. 7 illustrates a top view of transistor 38 in accordance with some embodiments. TMD layer 20 includes metallic edges 20M extending in a direction perpendicular to the channel length direction (the direction connecting source region 40 and drain region 41). TMD layer 20 also includes semi-conductive edges 20S overlapped by gate dielectric 42 and gate electrode 44. Semi-conductive edges 20S may be parallel to the channel length direction. Semi-conductive edges 20S may have the armchair atomic configuration as shown in FIG. 1. With the semi-conductive edges 20S passing below gate electrode 44, the leakage current between source region 40 and drain region 41 is low.

As a comparison, if the metallic edges passing below gate electrode 44, and the semi-conductive edges contact the edges of contact plugs 34, the leakage will be high, and the contact resistance will be high. This is because a metallic edge oriented in the source-to-drain direction would conduct (even though a gate line may straddle across the channel region), leading to substantial off-state leakage between the source region and the drain region of a transistor having a TMD channel. Therefore, the structure shown in FIG. 7 is more suited for transistors.

Figure 8:
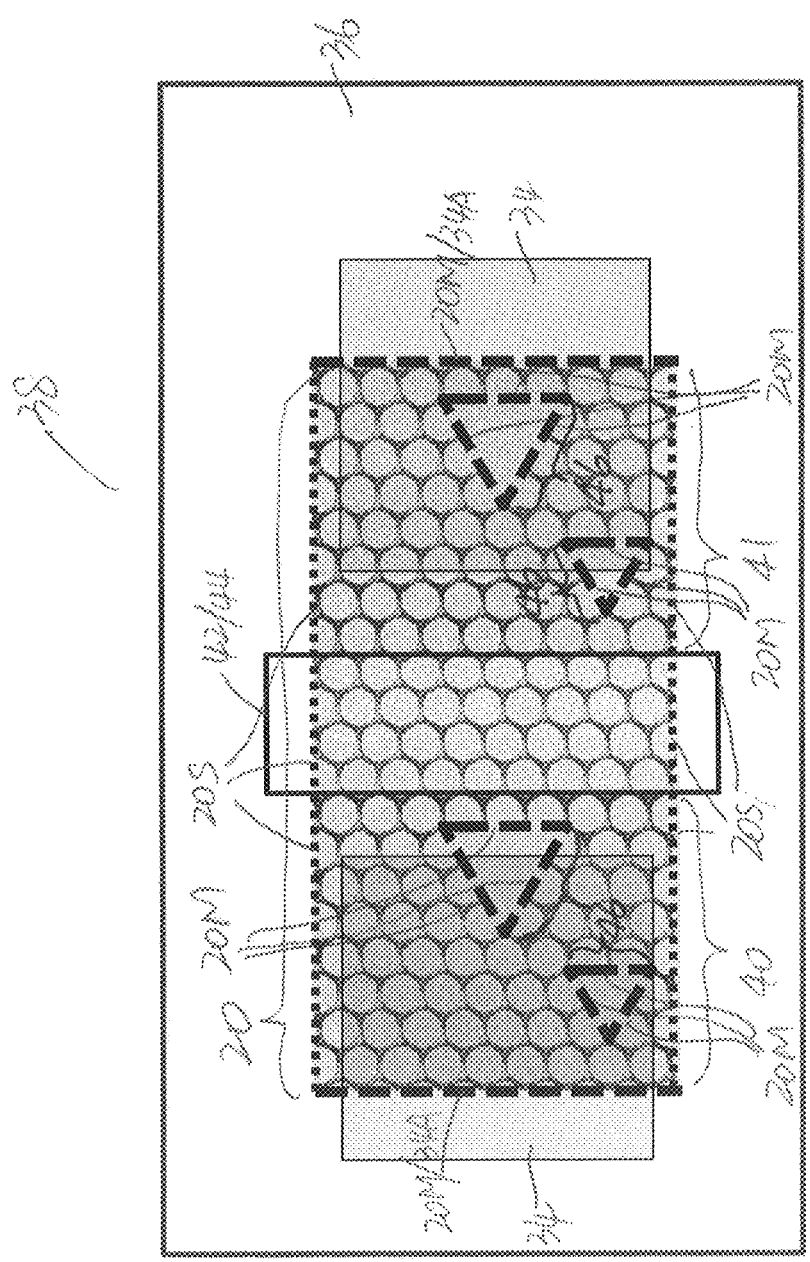

FIG. 8 illustrates a top view of transistor 38 in accordance with alternative embodiments. These embodiments are similar to the embodiments in FIGS. 6 and 7. In addition to the features shown in FIGS. 6 and 7, openings 46 are formed in TMD layers 20, and penetrate through TMD layer 20. The top-view shapes of openings 46 may be triangles, rectangles, hexagons, any other polygons, or irregular shapes. Contact plugs 34 may completely or partially overlap (and penetrate into) openings 46. As a result, contact plugs 34 extend into and penetrate through TMD layer 20 to contact dielectric layer 36. The portions of contact plugs 34 are referred to as the via portions of contact plugs 34 hereinafter.

FIG. 8 illustrates that some of exemplary edges 20M in openings 46 are fully in contact with contact plugs 34, while some other edges 20M have first portions in contact with one of the contact plugs 34, and second portions not in contact with any contact plug 34. The second portions thus do not contribute to the reduction of contact resistance. There may also be an entire edge of opening that is not in contact with any contact plug 34, as also shown in FIG. 8.

In accordance with some embodiments of the present disclosure, at least one, and may be more or all of the edges of openings 46 are metallic edges. These metallic edges 20M are in contact with the edges of the via portions of contact plugs 34. Accordingly, the Ohmic contact interface area between contact plugs 34 and source/drain regions 40/41 is further increased, and contact resistance is further reduced.

In accordance with some embodiments of the present disclosure, openings 46 are formed by a masked ion bombardment on TMD layer 20, followed by a wet or dry etching to remove some portions of TMD layer 20, leaving openings 46. The ion bombardment involves the introduction of energetic ions of argon, germanium, silicon (or any other element or molecular ions), which incur damage to the two-dimensional crystal structure of TMD layer 20. Such crystal defects are weak spots where materials can be removed during wet etching, dry etching, or exposure to a reactive gas. For example, a dry plasma etching may be performed in an oxygen or fluorine-containing plasma to form openings 46. The dry etching can also be performed using xenon difluoride ($XeF_2$). Annealing TMD layer 20 with defects in an oxygen-containing ambient at temperatures above 300 degrees Celsius may also lead to the formation of triangular openings 46. The edges of openings 46 may be optionally passivated, e.g. by annealing in a sulfur-containing gas such as hydrogen sulfide ($H_2S$). In alternative embodiments, in the formation of openings 46, the masked ion bombardment is skipped, while a wet etching, a dry etching, or a reactive gas exposure is performed.

Figure 9:
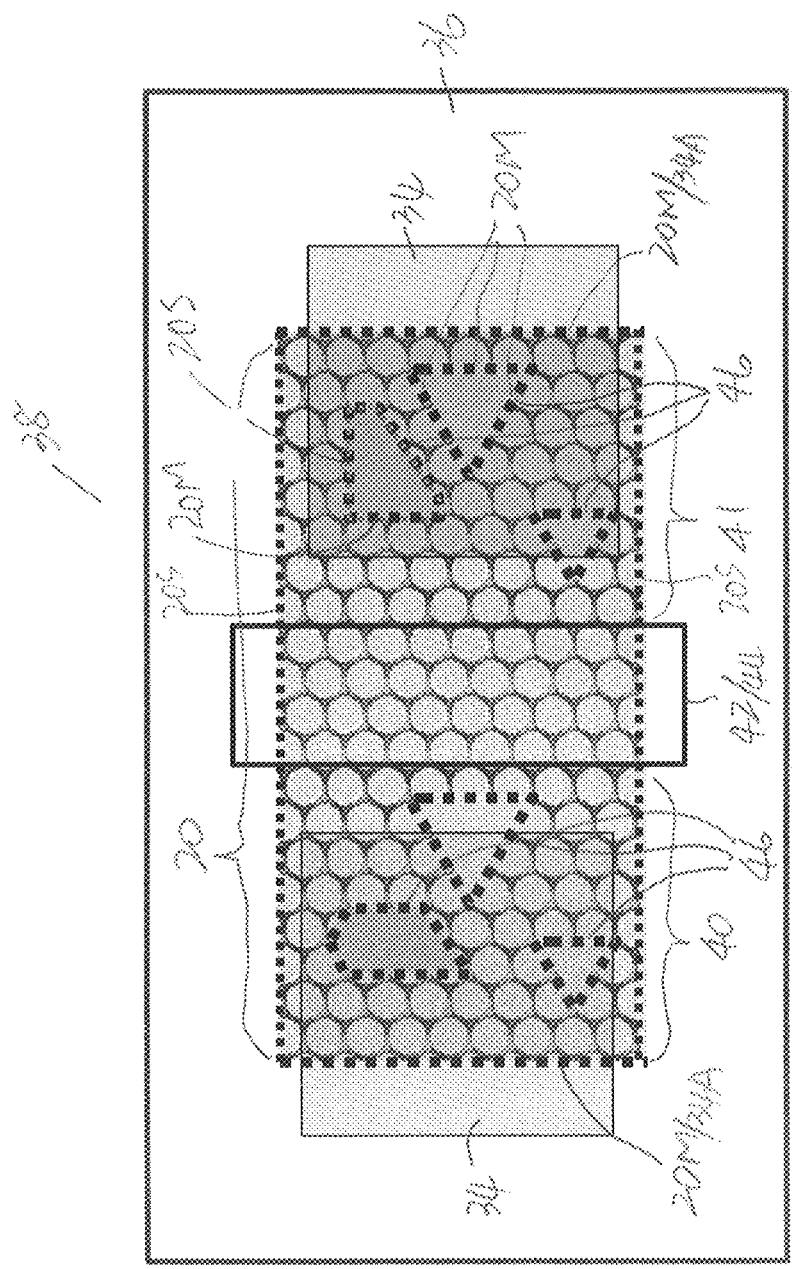

FIG. 9 illustrates a top view of transistor 38 in accordance with yet alternative embodiments. These embodiments are similar to the embodiments in FIG. 8, except openings 46 in TMD layer 20 include both semi-conductive edges 20S and metallic edges 20M. Although the contact resistance between semi-conductive edges 20S and contact plugs 34 is higher than the contact resistance between metallic edges 20M and contact plugs 34, semi-conductive edges 20S and contact plugs 34 still contribute to the increased interface areas, and still contribute to the reduction of contact resistance.

Figure 10:
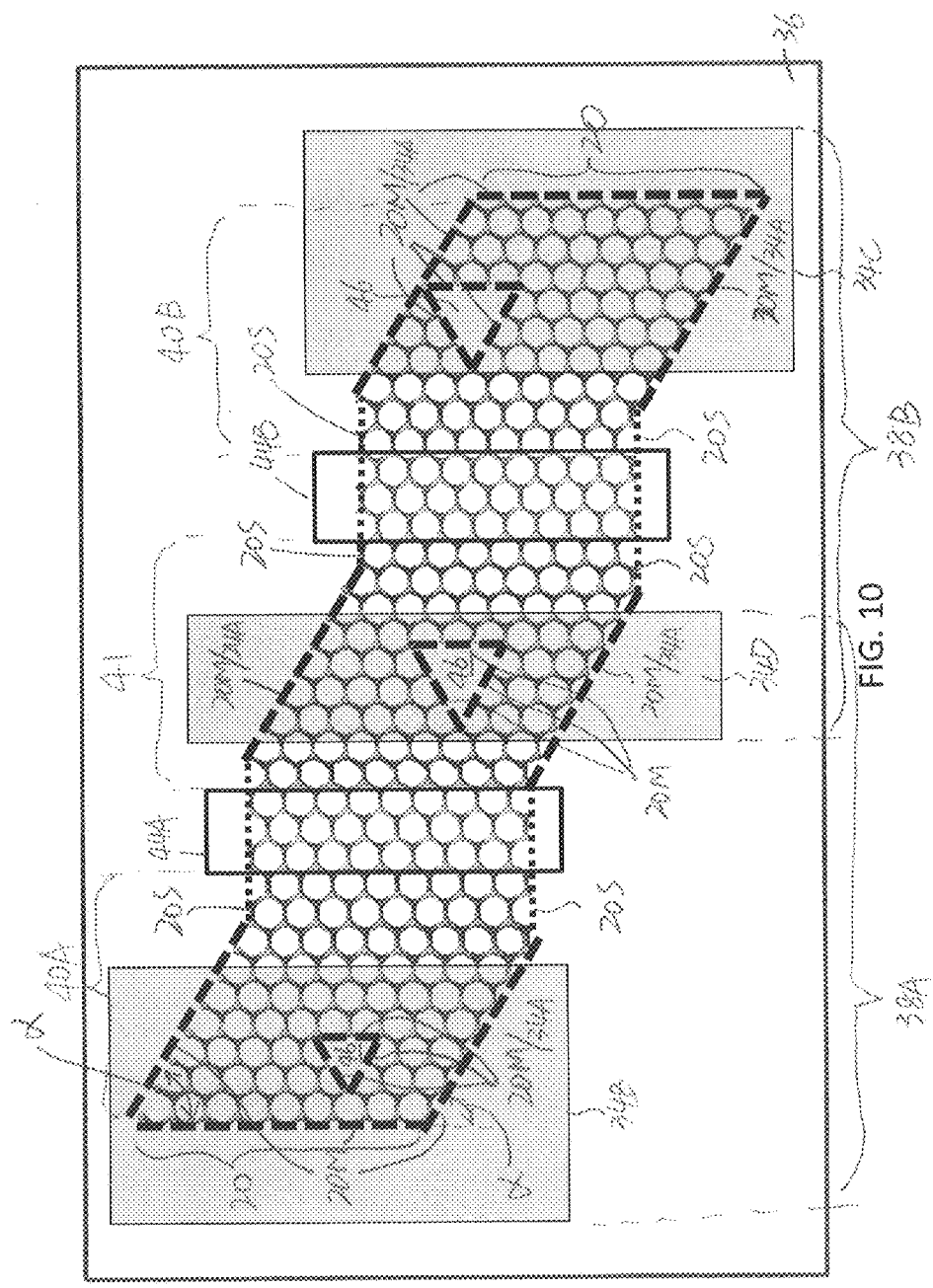
Figure 11:
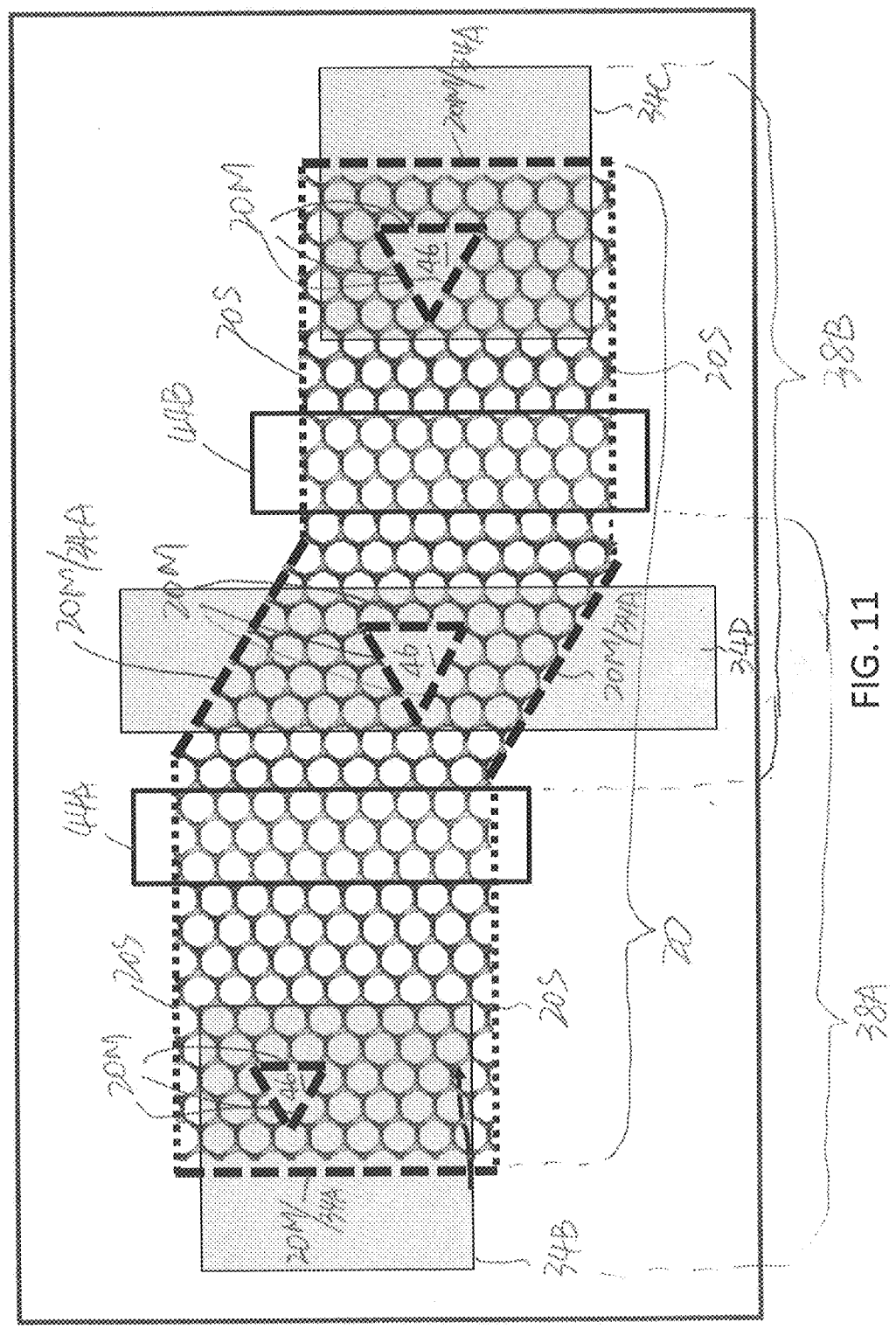
Figure 12:
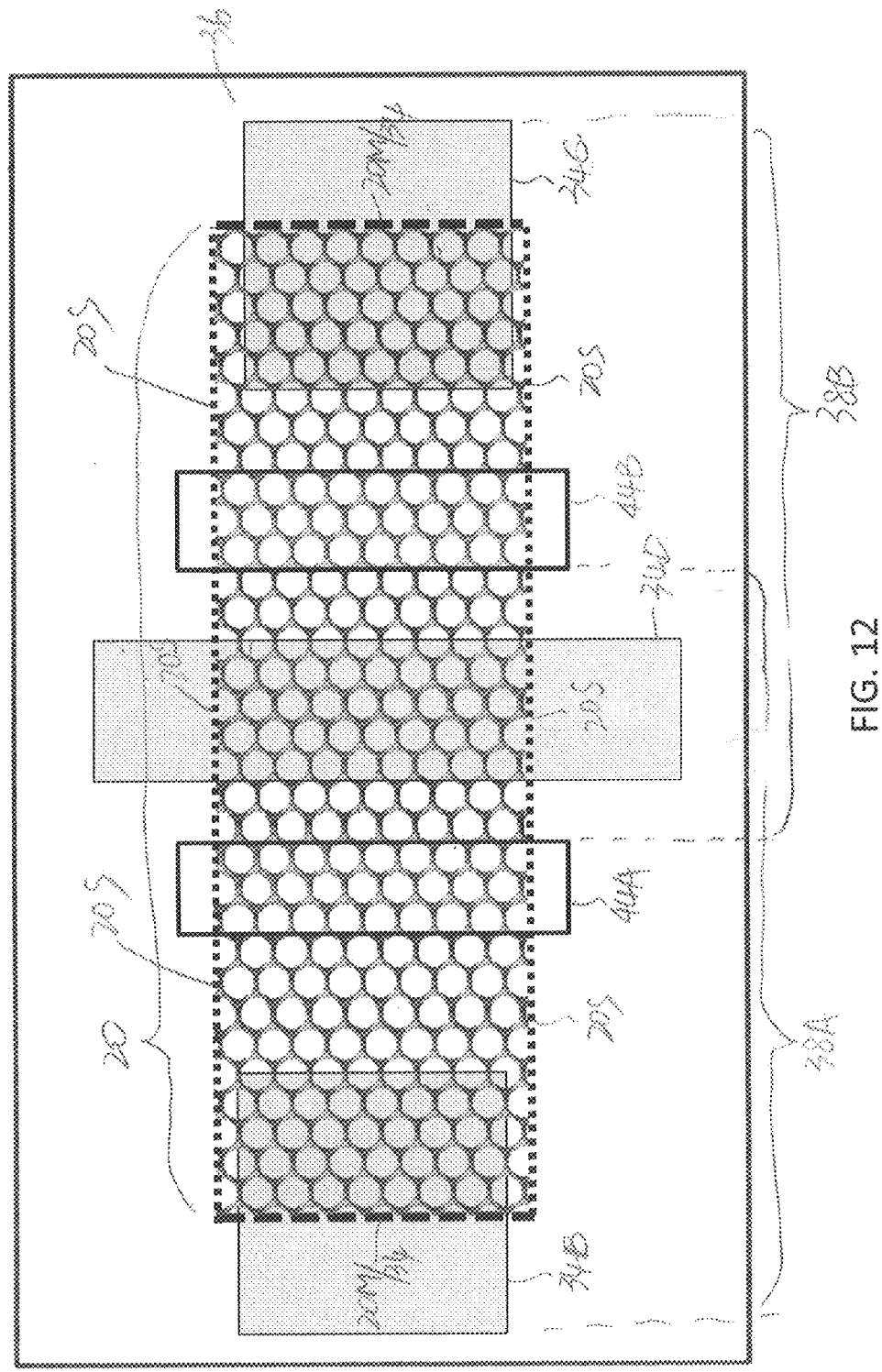

FIGS. 10 through 12 illustrate the top views of transistors 38A and 38B, which share a common source or a common drain. In accordance with some embodiments of the present disclosure, the common sourced/drain region is a common drain region. The concept of the present disclosure is readily applicable to the transistors with a common source region.

Referring to FIG. 10, a continuous TMD layer 20 is shared by transistors 38A and 38B, and forms the channel regions and the source/drain regions of transistors 38A and 38B. Transistor 38A includes gate electrode 44A, which crosses semi-conductive edges 20S of TMD layer 20. Transistor 38B includes gate electrode 44B, which crosses semi-conductive edges 20S of TMD layer 20. This results in the advantageous reduction of leakage current between source and drain regions.

Contact plug 34B contacts three metallic edges 20M. Accordingly, the contact resistance between contact plug 34B and source region 40A is small. Two of metallic edges 20M in contact with contact plug 34B are parallel with each other, and the other metallic edge 20M join the two parallel edges 20M, with angle α being 60 degrees. Similarly, contact plug 34C is in contact with three metallic edges 20M of source region 40B, and hence the contact resistance between contact plug 34C and source region 40B is small.

Drain region 41 is the common drain region shared by transistors 38A and 38B. Drain contact plug 34D includes edges 34A in contact with edges 20M of TMD layer 20. Accordingly, the contact resistance between drain contact plug 34D and the common drain region 41 is low. Furthermore, edges 20M underlying drain contact plug 34D is neither parallel nor perpendicular to the lengthwise direction of gate electrodes 44A and 44B.

In addition, openings 46 may be formed in source regions 40A and 40B and/or drain region 41. Source regions 40 and/or drain region 41 have metallic edges 20M inside openings 46. As a result, contact plugs 34B, 34C, and 34D may extend into openings 46 to contact the metallic edges 20M, and hence the contact resistance between contact plugs 34B, 34C, and 34D and the respective source and drain regions is further reduced.

FIG. 11 illustrates transistors 38A and 38B in accordance with yet alternative embodiments. These embodiments are similar to the embodiments in FIG. 10, except each of contact plugs 34B and 34C is in contact with a single, rather than three metallic edges 20M. Although the transistors in these embodiments have higher source contact resistance than the embodiments in FIG. 10, the area occupied by the transistors in accordance with these embodiments may be smaller.

FIG. 12 illustrates transistors 38A and 38B in accordance with yet alternative embodiments. These embodiments are similar to the embodiments in FIG. 11, except drain contact plug 34D is in contact with semi-conductive edges 20S, rather than metallic edges 20M. Although the transistors in these embodiments have a higher drain contact resistance than the embodiments in FIG. 11, the area occupied by the transistors in accordance with these embodiments may be smaller.

Figure 13:
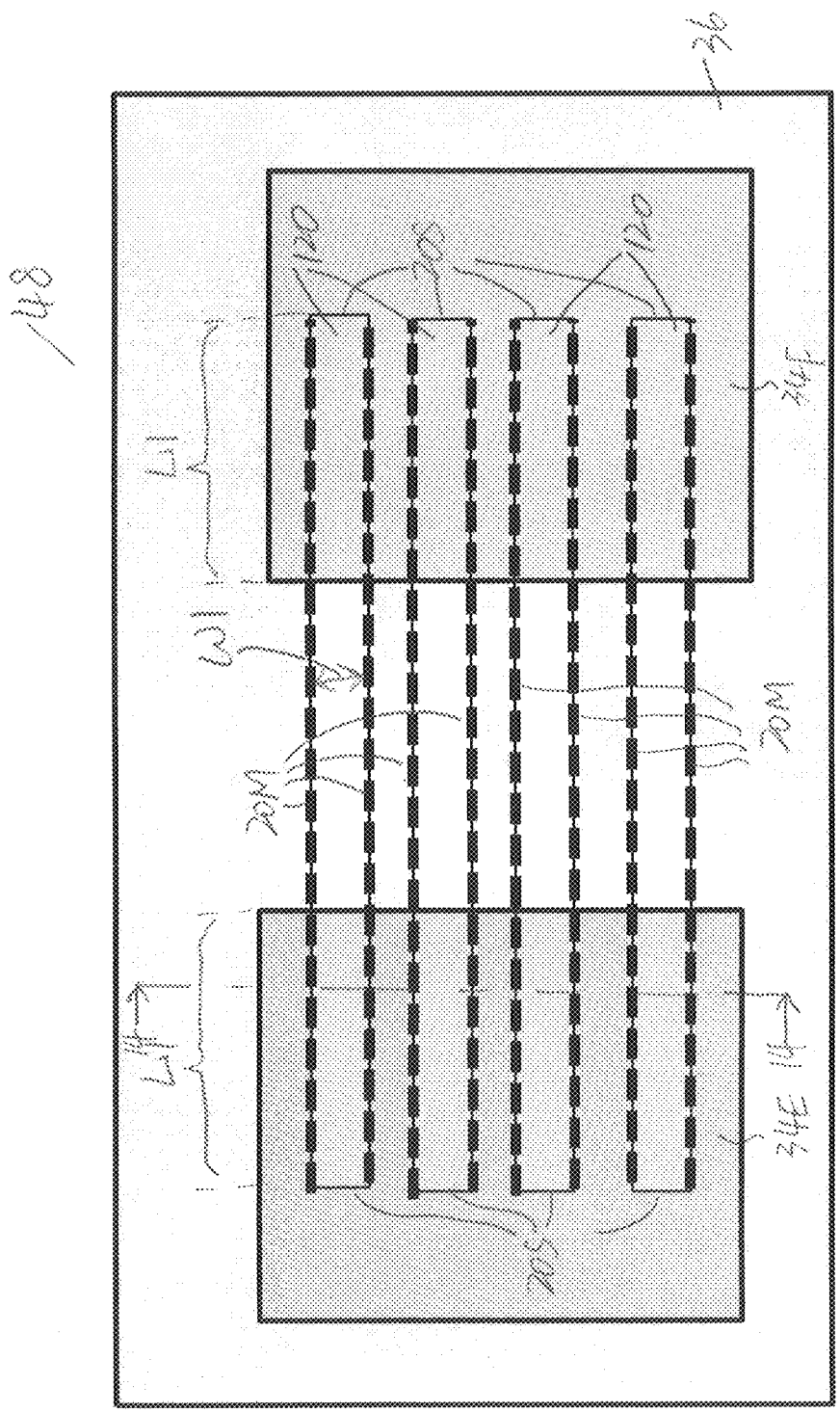
FIGS. 13 and 14 illustrate a top view and a cross-sectional view, respectively, of a resistor formed of TMD regions in accordance with some embodiments.

FIG. 13 illustrates a top view of resistor 48 in accordance with some exemplary embodiments. Resistor 48 is formed over dielectric layer 36. Resistor 48 includes at least one, and possible a plurality of TMD strips 120. TMD strips 120 may be formed of essentially the same material as that of TMD layers 20 shown in FIGS. 1 and 2. The shape and the sizes (such as length and widths) of TMD strips 120 may be different from each other or identical to each other. Metallic edges 20M of TMD strips 120 are in the lengthwise directions of TMD strips 120. Width W1 of TMD strips 120 may be smaller than about 20 nm, or smaller than about 10 nm. Length L1 of the interface between TMD strips 120 and contact plugs 34E and 34F may be greater than about 10 nm. Contact plugs 34E and 34F are formed on the opposite ends of TMD strips 120. The portions of TMD strips 120 between contact plugs 34E and 34F are the resistive portions of the resistor.

Figure 14:
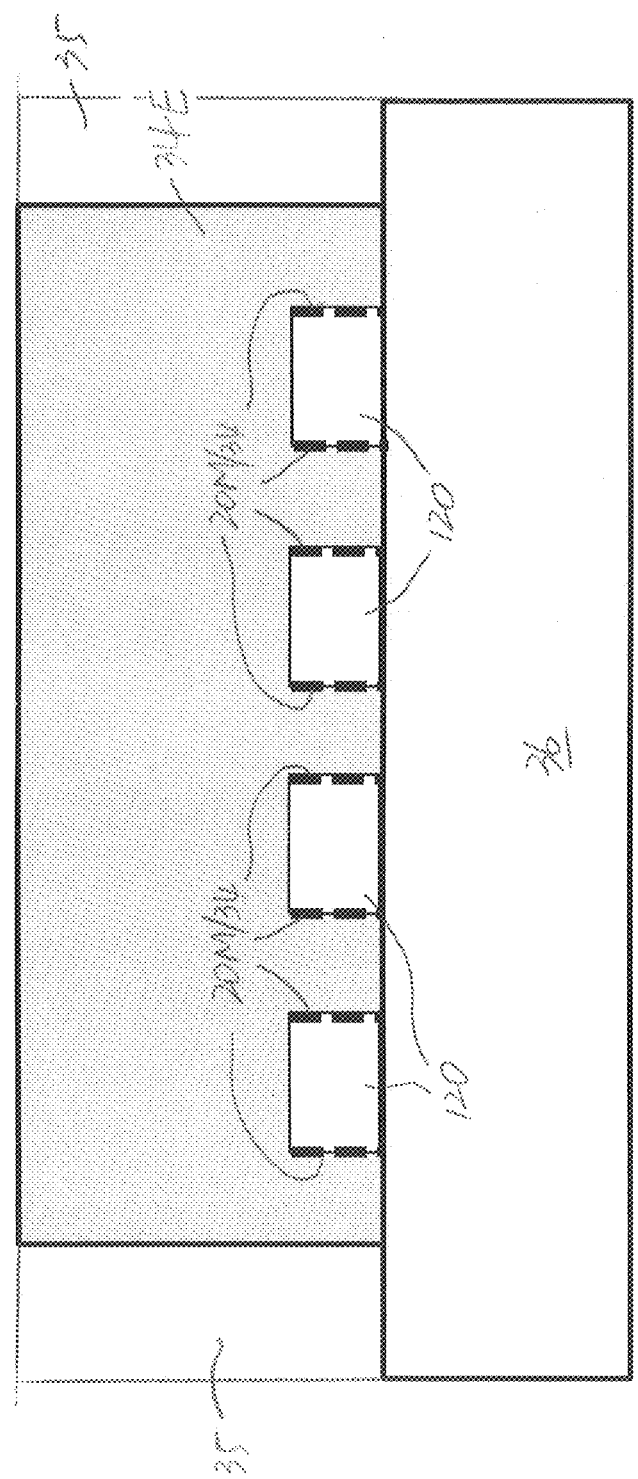

FIG. 14 illustrates a cross-sectional view of the structure shown in FIG. 13, wherein the cross-sectional view is obtained from the plane containing line 14-14 in FIG. 13. Contact plugs 34E and 34F have bottom surfaces contacting the top surfaces of TMD strips 120, and edges contacting the metallic edges 20M of TMD strips 120. Contact plugs 34E and 34F are formed in dielectric layer 35 in some embodiments. Accordingly, the contact resistance of the resistor 48 is significantly reduced due to the interface between contact plugs 34E and 34F and metallic edges 20M. Furthermore, the contact resistance is inversely proportional to the number of TMD strips 120, and hence increasing the number of TMD strips 120 advantageously reduces the contact resistance.

Figure 15:
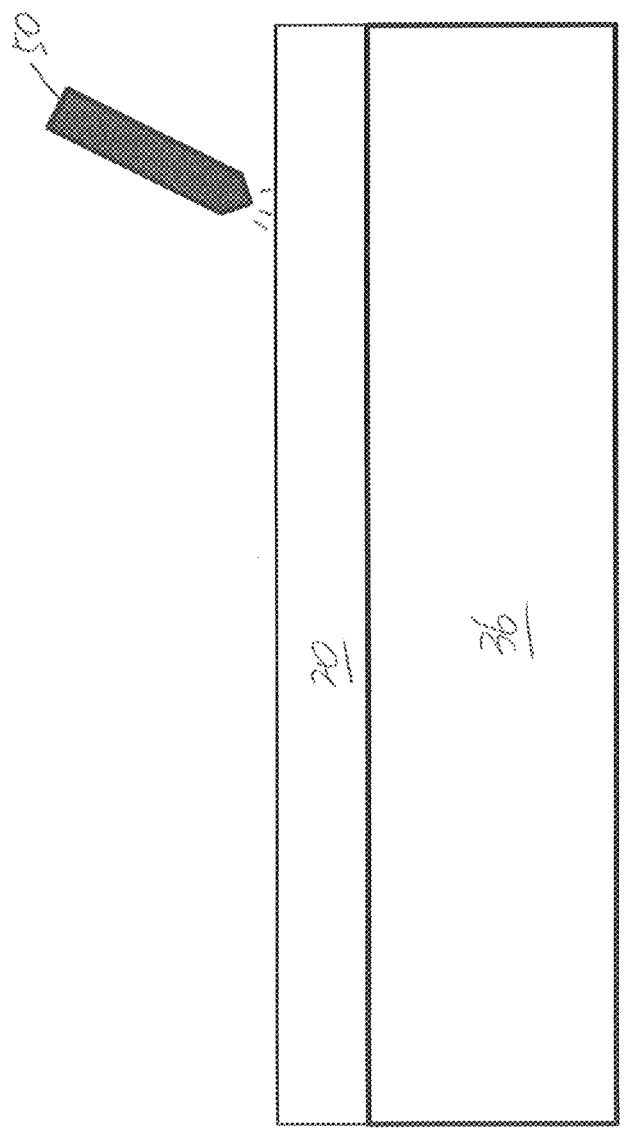
FIGS. 15 through 18 illustrate an exemplary process for forming TMD layers with metallic and semi-conductive edges.
Figure 16:
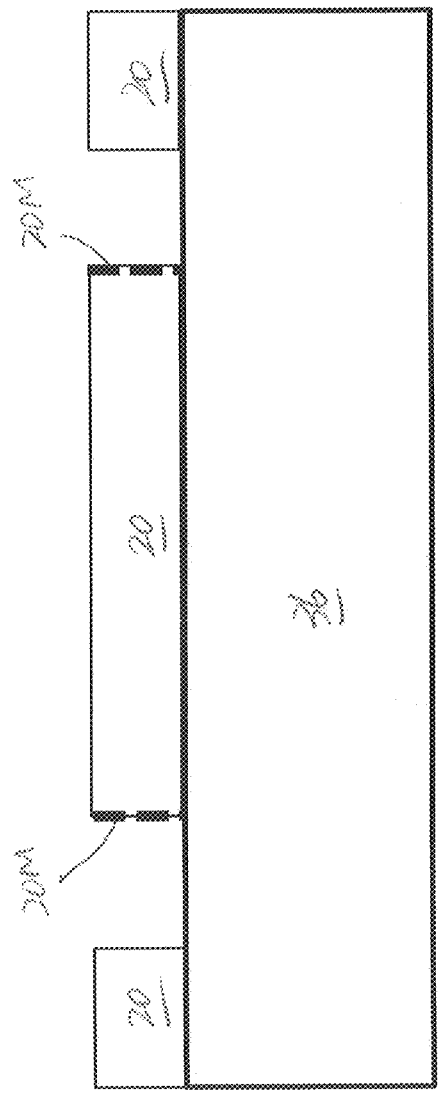
Figure 17:
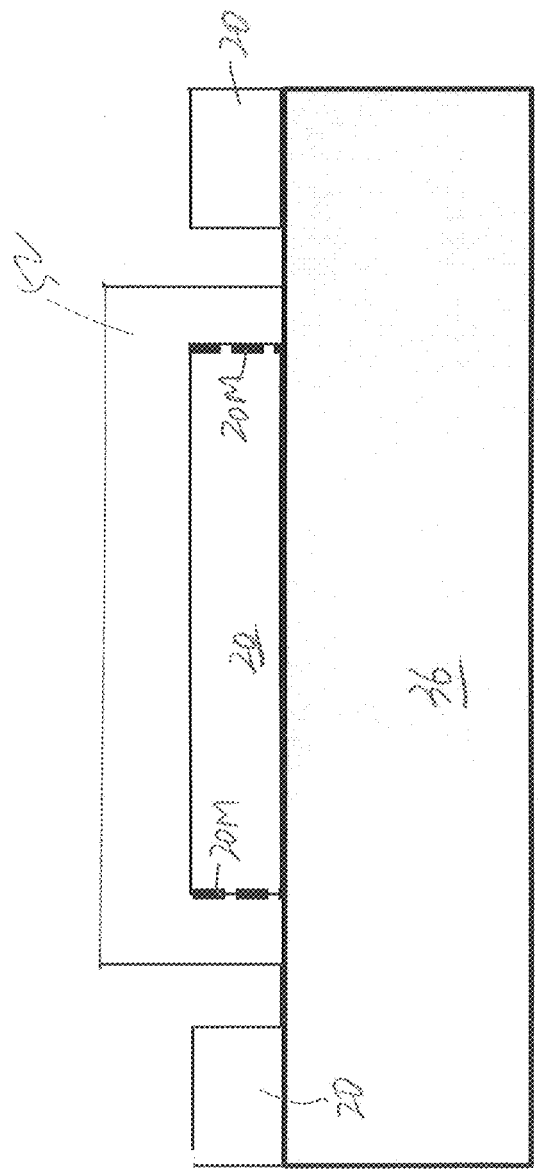

FIGS. 15 through 17 illustrate an exemplary process for forming TMD layers having the intended metallic and semi-conductive edges. Referring to FIG. 15, TMD layer 20 is formed over dielectric layer 36 as a blanket layer. Next, a Scanning Tunneling Microscopy (STM) is used to determine the distribution of atoms in TMD layer 20, and find out the orientations of the atoms in TMD layer 20. The directions of the semi-conductive edges and metallic edges thus are found.

Next, as also shown in FIG. 15, STM tip 50 is brought close to the surface of TMD layer 20, with a voltage (for example, between about 2V and about 5V) applied on STM tip 50. Accordingly, the portion of TMD layer 20 under STM tip 50 is removed. STM tip 50 is moved in a desirable direction to generate a metallic edge or a semi-conductive edge, depending on the requirement of the resulting device. FIG. 16 illustrates an exemplary embodiment in which the resulting edges are metallic edge 20M. Semi-conductive edges may also be formed using STM tip 50.

Figure 18:
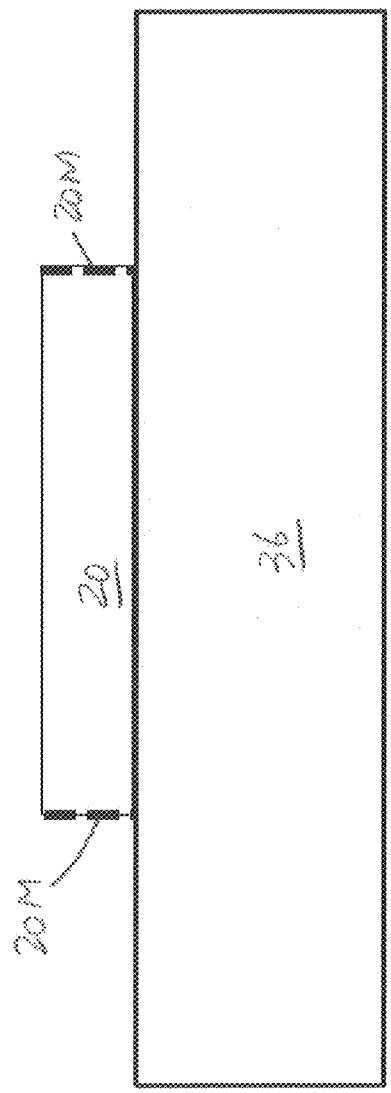

Next, as shown in FIG. 17, a photo lithography process is performed. Photo resist 52 is applied to protect the desirable portions of TMD layer 20, and the undesirable portions of TMD layer 20 are exposed. The undesirable portions are then removed in an etching process, leaving the structure as shown in FIG. 18. Photo resist 52 is then removed. By using the STM tip to form the desirable metallic and semi-conductive edges, the process margin of the etching process is increased, so that even if the photo lithography process may not have the atom-level accuracy, the semi-conductive edges and metallic edges may still be formed. In alternative embodiments, the cutting using the STM tip is skipped.

The embodiments of the present disclosure have some advantageous features. By forming contact plugs to contact the metallic edges of the TMD materials, the contact resistance is significantly reduced. On the other hand, semi-conductive edges may be used in certain places such as underlying the gate electrode to reduce the leakage current.

In accordance with some embodiments of the present disclosure, a device includes a transition metal dichalcogenide layer having a first edge with a zigzag atomic configuration. A metallic material has a portion overlapping the transition metal dichalcogenide layer. The metallic material has a second edge contacting the first edge of the transition metal dichalcogenide layer.

In accordance with alternative embodiments of the present disclosure, a device includes a dielectric layer, and a transition metal dichalcogenide layer overlying the dielectric layer. The transition metal dichalcogenide layer has a metallic edge. A contact plug has a first portion overlapping the transition metal dichalcogenide layer, and a second portion misaligned with the transition metal dichalcogenide layer. The second portion of the contact plug has an edge in contact with the metallic edge of the transition metal dichalcogenide layer.

In accordance with alternative embodiments of the present disclosure, a device includes a transition metal dichalcogenide layer. The transition metal dichalcogenide layer includes a source region having a first edge with a first zigzag atomic configuration, a drain region having a second edge with a second zigzag atomic configuration, and a channel region between the source region and the drain region. The channel region has two opposite edges having an armchair atomic configuration. The device further includes a source contact plug having a first bottom surface contacting a top surface of the source region, and a third edge contacting the first edge. The device further includes a drain contact plug having a second bottom surface contacting a top surface of the drain region, and a fourth edge contacting the second edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a transition metal dichalcogenide layer comprising a first edge having a zigzag atomic configuration; and
    a metallic material having a portion overlapping the transition metal dichalcogenide layer, wherein the metallic material comprises an edge contacting the first edge of the transition metal dichalcogenide layer.

2. The device of claim 1, wherein the metallic material further comprises a bottom surface contacting a top surface of the transition metal dichalcogenide layer.

3. The device of claim 1 further comprising:
    a Field-Effect Transistor (FET) comprising:
        a gate dielectric overlapping a middle portion of the transition metal dichalcogenide layer, wherein the transition metal dichalcogenide layer comprises a first source/drain region and a second source/drain region, with the first edge being an edge of the first source/drain region; and
        a gate electrode overlying the gate dielectric.

4. The device of claim 3, wherein the transition metal dichalcogenide layer further comprises a second edge extending from the first source/drain region to the second source/drain region, with the second edge having a portion overlapped by the gate electrode, wherein the second edge has an armchair atomic configuration.

5. The device of claim 3, wherein the first source/drain region further comprises a third edge contacting the metallic material, wherein the third edge is neither parallel nor perpendicular to the first edge, and the third edge has a zigzag atomic configuration.

6. The device of claim 3, wherein the second source/drain region further comprises two edges parallel with each other and contacting edges of a contact plug of the FET, wherein the two edges are neither parallel nor perpendicular to the first edge.

7. The device of claim 3, wherein the first source/drain region further comprises an opening penetrating through the transition metal dichalcogenide layer, with the metallic material comprising a via portion penetrating through the opening, wherein the transition metal dichalcogenide layer comprises portions on opposite sides of the opening, and wherein the transition metal dichalcogenide layer comprises at least a metallic edge in the opening.

8. The device of claim 7, wherein the transition metal dichalcogenide layer fully encircles the opening.

9. The device of claim 1, wherein the transition metal dichalcogenide layer forms a part of a resistor, with the metallic material further contacting the first edge to form a contact to an end of the resistor.

10. A device comprising:
    a dielectric layer;
    a transition metal dichalcogenide layer overlying the dielectric layer, wherein the transition metal dichalcogenide layer comprises a first metallic edge; and
    a contact plug having a first portion overlapping the transition metal dichalcogenide layer, and a second portion misaligned with the transition metal dichalcogenide layer, wherein the second portion of the contact plug has an edge in contact with the first metallic edge of the transition metal dichalcogenide layer.

11. The device of claim 10, wherein the transition metal dichalcogenide layer comprises:

a transitional metal element selected from the group consisting of Ti, V, Co, Ni, Zr, Mo, Tc, Rh, Pd, Hf, Ta, W, Re, Ir, and Pt; and a chalcogen selected from the group consisting of S, Se, and Te.

12. The device of claim 10, wherein the first metallic edge has a zigzag atomic configuration.

13. The device of claim 10, wherein the second portion of the contact plug is in physical contact with the dielectric layer.

14. The device of claim 10, wherein the contact plug comprises a via portion penetrating through the transition metal dichalcogenide layer to contact the dielectric layer, with the via portion of the contact plug fully encircled by the transition metal dichalcogenide layer, wherein the via portion of the contact plug contacts a metallic edge of the transition metal dichalcogenide layer.

15. The device of claim 14, wherein the first metallic edge of the transition metal dichalcogenide layer has zigzagged straight segments, with each of the zigzagged straight segments having a length greater than about 1 nm.

16. A device comprising:

a transition metal dichalcogenide layer comprising:

a source region comprising a first edge having a first zigzag atomic configuration;

a drain region comprising a second edge having a second zigzag atomic configuration; and a channel region between the source region and the drain region, wherein the channel region comprises two opposite edges having an armchair atomic configuration;

a source contact plug comprising a first bottom surface contacting a top surface of the source region, and a third edge contacting the first edge; and a drain contact plug comprising a second bottom surface contacting a top surface of the drain region, and a fourth edge contacting the second edge.

17. The device of claim 16, wherein the first edge and the second edge are neither parallel to nor perpendicular to the two opposite edges of the channel region.

18. The device of claim 16, wherein the source region further comprises a fifth edge contacting an additional edge of the source contact plug, with the fifth edge and the first edge joined with each other, wherein the fifth edge has a zigzag atomic configuration.

19. The device of claim 16, wherein the drain region further comprises a sixth edge contacting an additional edge of the drain contact plug, with the sixth edge and the second edge parallel to each other, wherein the sixth edge has a zigzag atomic configuration.

20. The device of claim 16, wherein one of the source contact plug and the drain contact plug comprises a via portion penetrating through the transition metal dichalcogenide layer, with the via portion fully encircled by the transition metal dichalcogenide layer, wherein the via portion of the one of the source contact plug and the drain contact plug contacts a metallic edge of the transition metal dichalcogenide layer.

* * * * *